United States Patent
Chow et al.

(10) Patent No.: US 6,374,832 B2
(45) Date of Patent: *Apr. 23, 2002

(54) WAFERLESS SEASONING PROCESS

(75) Inventors: Yu-Chang Chow, Hsinchu; Wen-Hua Cheng, Chu-Pei; Hung-Chen Yu, Yi-Lan Hsien; Chih-Ming Chi, Taichung Hsien, all of (TW)

(73) Assignee: United Microelectronics Corp., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/282,016

(22) Filed: Mar. 29, 1999

(30) Foreign Application Priority Data

Mar. 1, 1999 (TW) .......................................... 88103040

(51) Int. Cl.$^7$ .................................................. B08B 6/00

(52) U.S. Cl. ..................... 134/1.1; 134/1.2; 134/22.1; 438/905

(58) Field of Search .......................... 134/1.1, 1.2, 22.1; 438/905

(56) References Cited

U.S. PATENT DOCUMENTS

| | | | | |
|---|---|---|---|---|
| 5,681,424 A | * | 10/1997 | Saito et al. | 438/738 |
| 5,812,403 A | * | 9/1998 | Fong et al. | 364/468.28 |
| 5,885,902 A | * | 3/1999 | Blasingame et al. | 438/738 |
| 6,014,979 A | * | 1/2000 | Van Autryve et al. | 134/1.1 |

* cited by examiner

*Primary Examiner*—Benjamin L. Utech
*Assistant Examiner*—Charlotte A. Brown
(74) *Attorney, Agent, or Firm*—J. C. Patents

(57) ABSTRACT

A waferless seasoning process is described, which waferless seasoning process is suitable for an etching chamber of an etching machine when the etching environment is so bad that etching cannot be performed. A dry cleaning process with a plasma formed by oxygen and hydrogen bromide is performed to restore the etching environment in the etching chamber.

20 Claims, 5 Drawing Sheets

WAFERLESS SEASONING PROCESS

CROSS-REFERENCE TO RELATED APPLICATION

This application claims the priority benefit of Taiwan application serial no. 88103040, filed Mar. 1, 1999, the full disclosure of which is incorporated herein by reference.

BACKGROUND OF THE INVENTION

1. Field of the Invention

The present invention relates to a cleaning process for cleaning an etching chamber of an etching machine. More particularly, the present invention relates to a waferless seasoning process to avoid the first wafer effect.

2. Description of the Related Art

In the process for manufacturing the gate electrode of a transistor, an anisotropic etching step is a common method used to pattern the gate electrode. In the anisotropic etching step, particles with high energy in a plasma are used to bombard and etch the conductive layer comprising a tungsten silicon layer and a polysilicon layer, so that some deposition, such as particles or polymer, accumulate on the inner wall of the etching chamber. Because the plasma bombards the deposit during performance of the anisotropic etching step and the deposit may fall on the wafer during the etching process, a critical dimension bias (CD bias) of the devices occurs.

When the deposit is thick enough to affect the etching process after the etching process is performed many times or when the etching environment in the etching chamber changes after the etching machine is idle for more than one hour, it is necessary to restore the etching chamber by a seasoning process. The seasoning process is a pre-treatment of the etching process.

Conventionally, the seasoning process comprises the steps of a dry cleaning process and an etching-chamber recovery process. The step of the dry cleaning process comprises the steps of placing three wafers in the etching chamber after the radio frequency (RF) electrical power supplier of the etching chamber operates for 500 minutes and then cleaning the etching chamber by a plasma for 5 minutes to remove the deposit on the inner wall of the etching chamber, wherein the plasma is a mixed gas comprising chlorine ($Cl_2$) and sulfonium hexafluoride ($SF_6$).

Thereafter, the etching-chamber recovery process is performed. Since the most of the deposit in the etching chamber is removed by the dry cleaning process, the etching environment in the etching chamber is greatly changed and the etching result on the conductive layer is unstable. In order to attain the most stable devices possible, it is necessary to perform an etching-chamber recovery process to stabilize the etching environment in the etching chamber.

Typically, the etching-chamber recovery process comprises the steps of placing several dummy wafers in the etching chamber and then performing an etching-chamber recovery process by the plasma used in a normal etching process. The etching process for etching a conductive layer comprises three steps of etching a photoresist, a tungsten silicide layer and a polysilicon layer. Consequently, in the etching-chamber recovery process, the dummy wafers are first bombarded by a plasma for 90 seconds, wherein the plasma is formed by a mixed gas comprising oxygen and hydrogen bromide (HBr). Second, the dummy wafers are bombarded by a plasma for 140 seconds, wherein the plasma is formed by a mixed gas comprising $Cl_2$ and HBr. Finally, the dummy wafers are bombarded by a plasma for 100 seconds, wherein the plasma is formed by a mixed gas comprising HBr, helium and $HeO_2$. In the etching-chamber recovery process, it is necessary to use 3–10 dummy wafers.

However, since the plasma used to clean the etching chamber in the dry cleaning process is formed by gases having fluoric elements, several fluoric radicals stick to the inner wall of the etching chamber. The fluoric radicals sticking to the inner wall of the etching chamber react with the chlorine and hydrogen bromide HBr while the etching process is performed to etch the silicide layer or polysilicon layer, so that the uniformity of the wafer surface becomes worse and the CD bias is increased due to the shrinkage of the etching rate (ER) even affecting the etching selectivity between polysilicon and oxide. Incidentally, the dummy wafers used in the dry cleaning process and the etching-chamber recovery process leads to the consumption of the wafers.

Because the amount of the fluoric radicals is decreased and the etching environment is gradually restored while the etching process is performed, the quality of the first wafers etched is especially unstable after the dry cleaning process is performed. The etching result of the following wafers becomes more stable as the stability of the etching environment improves. Since the abnormal etching effect is relatively obvious when the etching process is performed on the first wafer after the seasoning process, the unstable etching effect is called the first wafer effect. Commonly, the problem of the first wafer effect occurs in the etching process for forming the gate electrode comprising a silicide layer and a conductive layer.

SUMMARY OF THE INVENTION

The invention provides a waferless seasoning process. By using the invention, wafer consumption and the cost are greatly reduced. Moreover, the first wafer effect can be avoided, the duration between two wet cleaning processes can be greatly extended and the throughput is enhanced.

To achieve these and other advantages and in accordance with the purpose of the invention, as embodied and broadly described herein, the invention provides a waferless seasoning process suitable for an etching chamber of an etching machine when the etching environment is so bad that an etching process cannot be performed. A dry cleaning process with a plasma formed by oxygen and hydrogen bromide is performed to restore the etching environment in the etching chamber.

The invention provides a waferless seasoning process suitable for an etching chamber of an etching machine when the etching environment is so bad that etching cannot be performed. A dry cleaning process with a first plasma formed by oxygen and sulfonium hexafluoride is performed. An etching-chamber restoration process with a second plasma formed by hydrogen is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
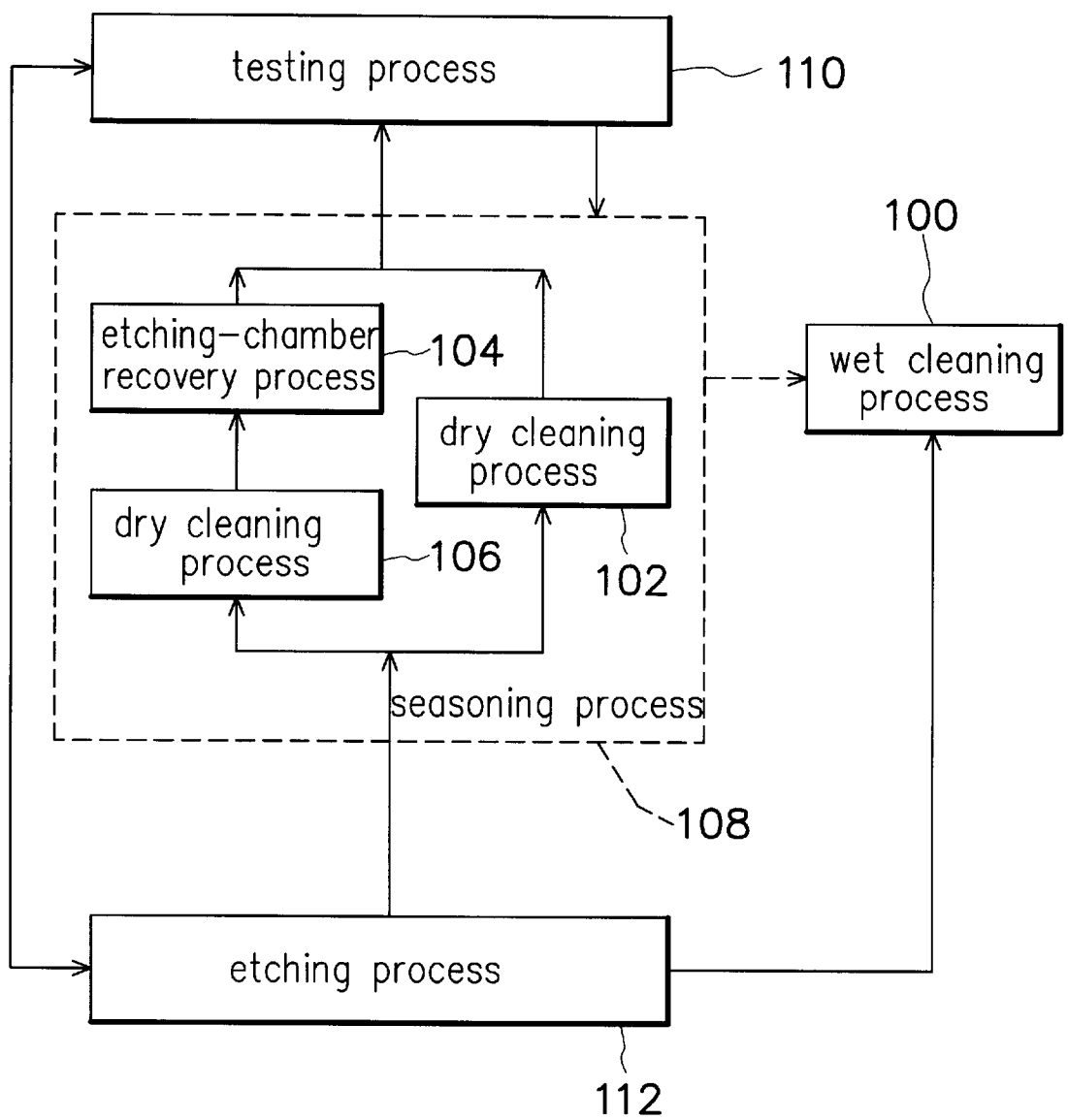
FIG. 1 is a flowchart of a method used to avoid the first wafer effect in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
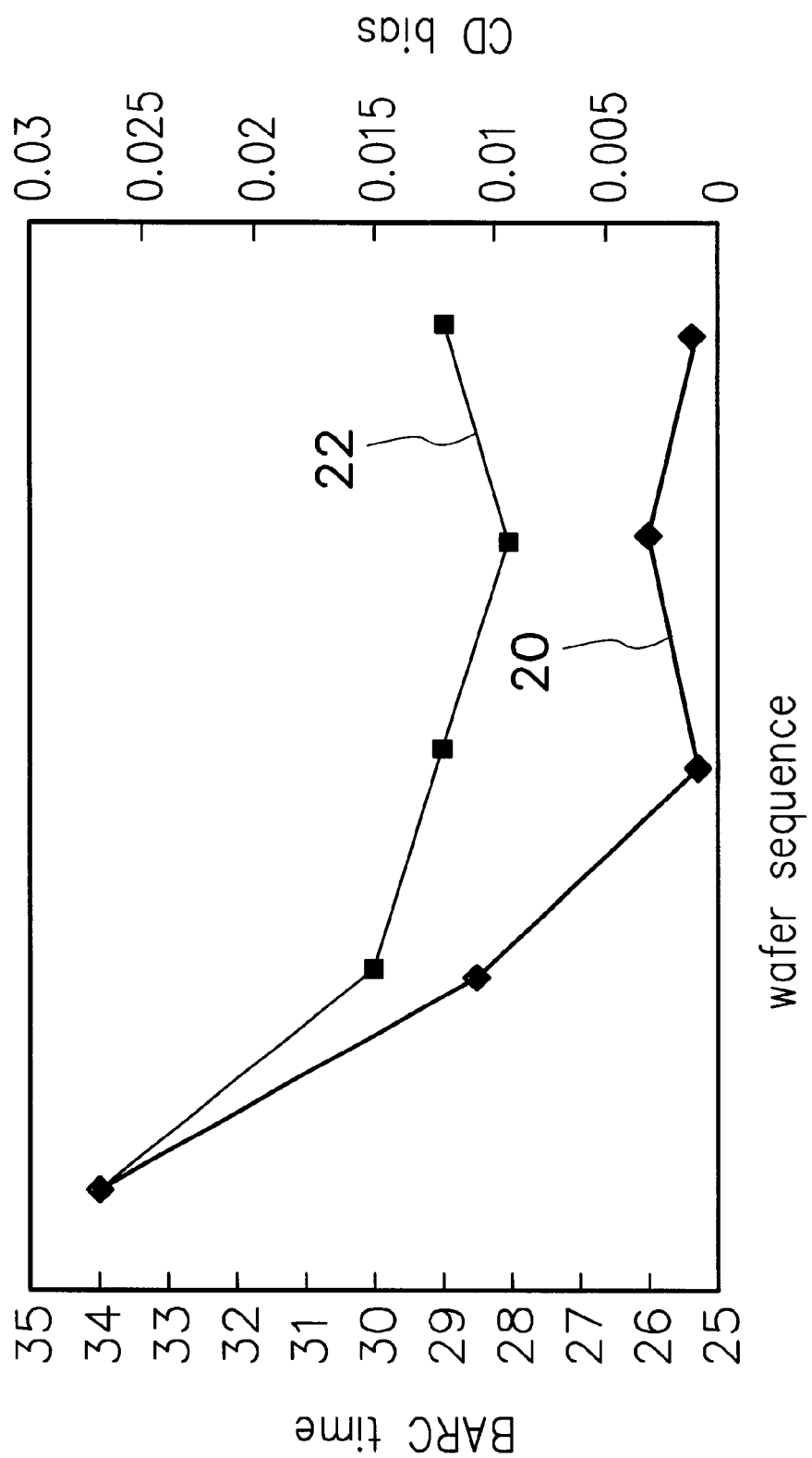
FIG. 2 is a plot of the bottom anti-reflection coating endpoint time (BARC EP time) and the critical dimension bias (CD bias) versus the wafer sequence after the etching process is performed.
Figure 3:
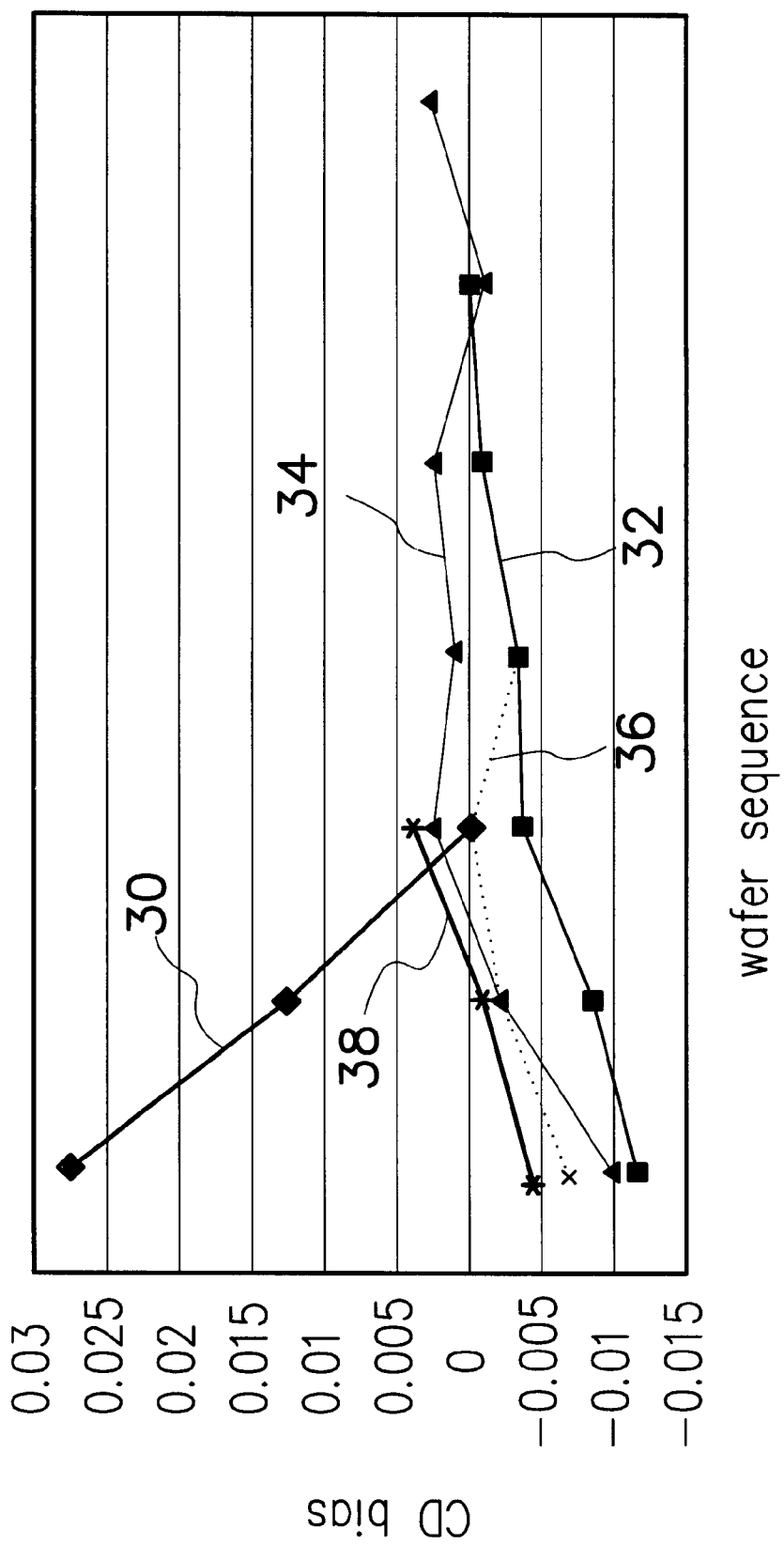
FIG. 3 is a plot of the critical dimension bias (CD bias) versus the wafer sequence.
Figure 4:
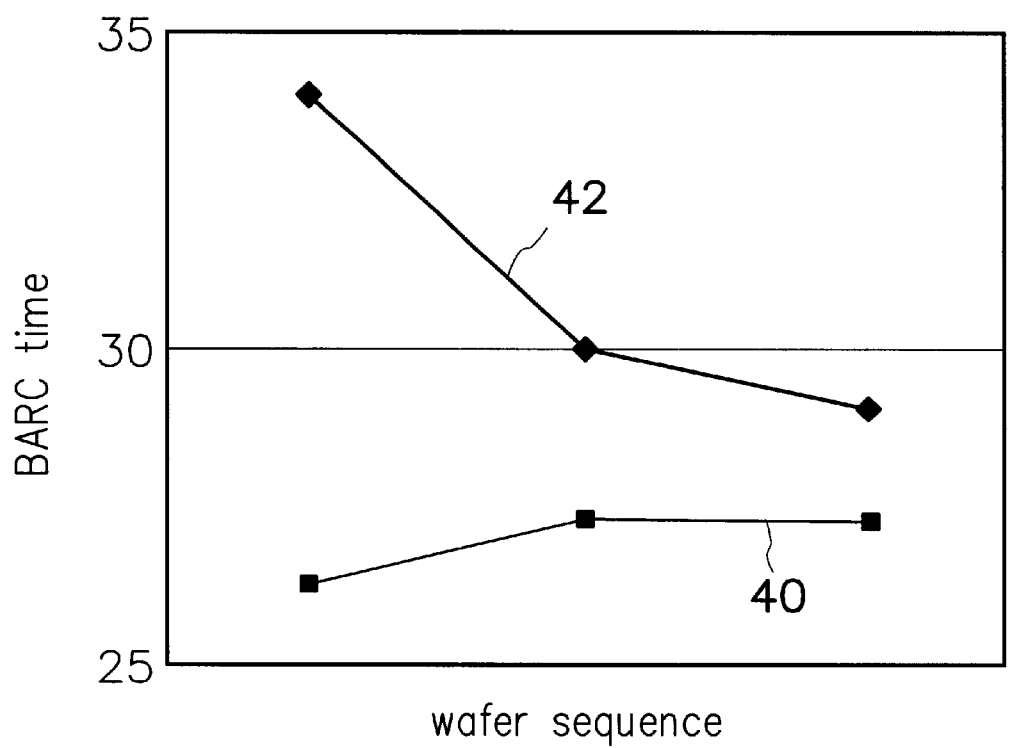
FIG. 4 is a plot of the bottom anti-reflection coating endpoint time (BARC EP time) versus the wafer sequence.
Figure 5:
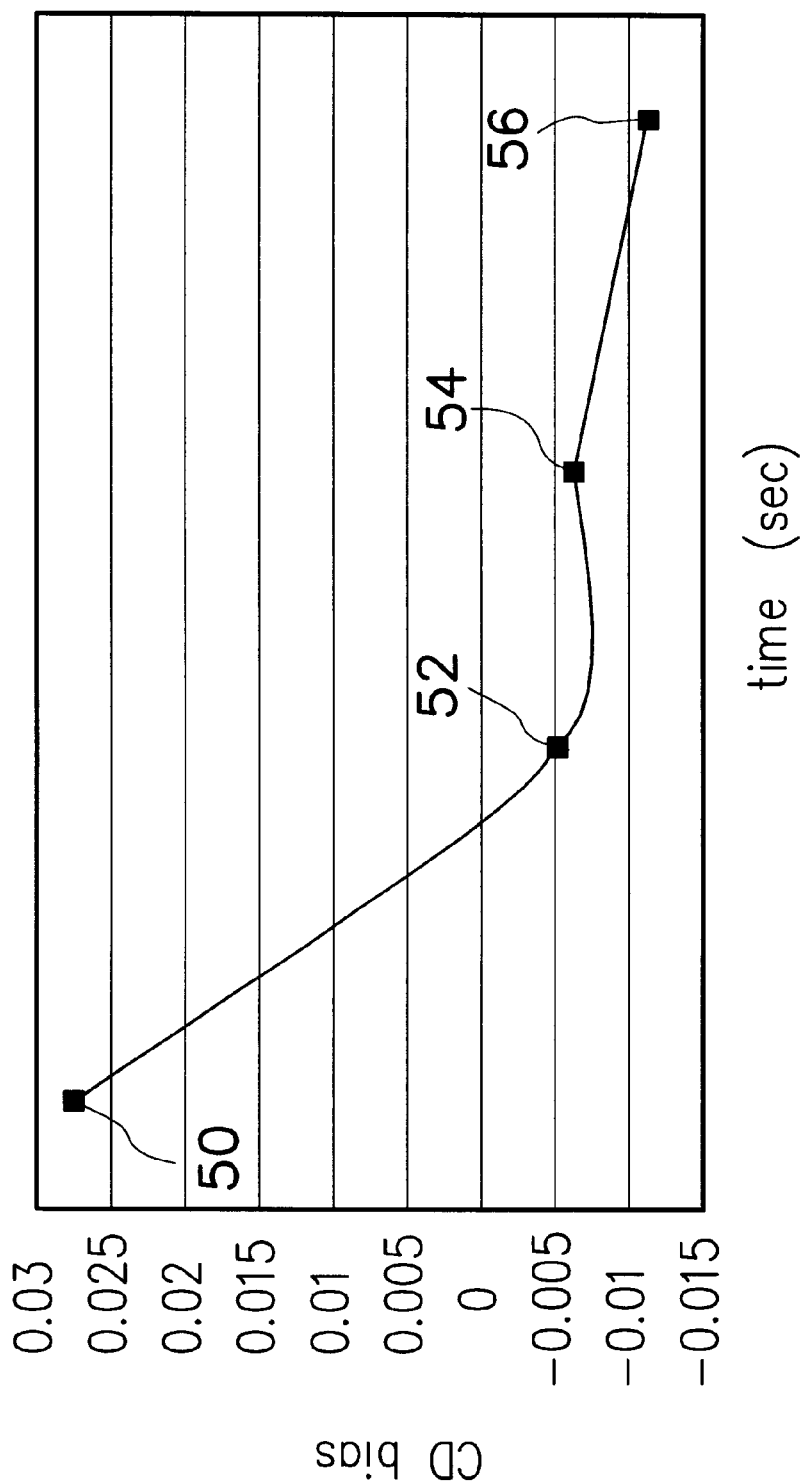
FIG. 5 is a plot of the critical dimension bias (CD bias) versus the duration of the seasoning process.

FIG. 1 is a flowchart of a method used to avoid the first wafer effect in a preferred embodiment according to the invention. FIG. 2 is a plot of the bottom anti-reflection coating endpoint time (BARC EP time) and the critical dimension bias (CD bias) versus the wafer sequence after the etching process is performed. FIG. 3 is a plot of the critical dimension bias (CD bias) versus the wafer sequence. FIG. 4 is a plot of the bottom anti-reflection coating endpoint time (BARC EP time) versus the wafer sequence. FIG. 5 is a plot of the critical dimension bias (CD bias) versus the duration of the seasoning process.

As shown in FIG. 1, when the etching environment in the etching chamber is changed after the etching machine is idle for more than one hour or when fluoric radicals exist in the etching chamber after the etching process 112 is performed many times, in order to avoid the first wafer effect, it is necessary to perform a waferless seasoning process 108 to season the etching chamber. The seasoning process 108 is a pre-treatment of the etching process. There are two different ways to perform the waferless seasoning process 108.

One way to perform the waferless seasoning process 108 is to clean the etching chamber by a dry cleaning process 102 with a plasma. In this example, the plasma can be formed by a mixed gas comprising HBr and oxygen for which the standard-cubic centimeter per minute (sccm) ratio of HBr to oxygen is about 50/20. The pressure of the plasma is about 10 milli-torr and the power of the plasma is about 700 W, and the plasma bombards the inner wall of the etching chamber for about of 60–300 seconds. There are no wafers in the etching chamber when the dry cleaning process 102 is performed.

Another way to perform the waferless seasoning process 108 is to clean the etching chamber by a dry cleaning process 104 and an etching-chamber recovery process 106. In this example, the dry cleaning process 104 is performed with a plasma and the plasma can be formed by a mixed gas comprising $SF_6$ and oxygen. The sccm ratio of oxygen to $SF_6$ is about 100/150. The pressure of the plasma is about 15 milli-torr and the power of the plasma is about 700 W, and the plasma bombards the inner wall of the etching chamber for about of 60–300 seconds. There are no wafers in the etching chamber when the dry cleaning process 104 is performed.

After the dry cleaning process 104, the etching-chamber recovery process 106 is performed. In this example, the etching-chamber recovery process 106 is performed with a plasma and the plasma can be formed by hydrogen. The pressure of the plasma is about 10–100 milli-torr and the power of the plasma is about 500–700 Watt, and the plasma bombards the inner wall of the etching chamber for about of 60–300 seconds. There are no wafers in the etching chamber when the etching-chamber recovery process 106 is performed.

The gases used to form the plasmas in the dry cleaning process 102 and etching-chamber recovery process 106 have hydrogen elements, so that the plasmas used in the dry cleaning process 102 and etching-chamber recovery process 106 will have hydrogen elements. Therefore, the hydrogen elements react with the fluoric radicals to prevent the plasma used in etching process from being affected by the fluoric radicals, and the stable etching environment can be maintained as the first wafer effect is eliminated.

In order to hold the etching process steady, a testing process 110 is performed to find out whether the etching rate, the amount of the particles and the uniformity of the wafer all fit the requirements after the waferless seasoning process 108. When the etching rate, the amount of the particles and the uniformity of the wafer all fit the requirements, the etching environment in the etching chamber is restored. The etching process is performed after the testing process 110. Conversely, when the testing results indicate that the etching environment in the etching chamber is not restored, that is, particle concentration in the etching chamber is more than 30 particles/$m^3$ with a particle size of 0.02 micrometer-diameter and larger, it is necessary to repeat the waferless seasoning process 108 and the testing process 110. If the etching environment is still so bad that etching cannot be performed after the waferless seasoning process 108 is repeated two times, it is necessary to perform a wet cleaning process 100 to restore the etching environment.

Additionally, an operation cycle is presented as the waferless seasoning process 108 performed after the etching process 112 is performed many times. However, when the waferless seasoning process 108 is unable to remove the deposit from the etching chamber to restore the etching environment to an ideal condition after the operation cycle has been performed for ten to twenty times, it is also necessary to perform the wet cleaning process 100 to restore the etching environment.

The etching machine needs to be shut down, and the etching machine is stripped and washed by chemical solvent when the wet etching process 100 is performed, requiring high manpower, time and cost expenditure. Nevertheless, by using the method according to the invention, the duration between two wet cleaning processes can be greatly extended. In the invention, there is no wafer in the etching chamber while the seasoning process is performed, so that wafer consumption is reduced. Therefore, the cost can be decreased. Moreover, by using the invention, the etching environment can be restored to a stable etching situation and the first wafer effect can be avoided, Hence, the throughput is greatly enhanced.

Furthermore, in the seasoning process 108, the plasma having HBr or hydrogen can help to stabilize the etching rate of etching the anti-reflection coating (ARC) above the silicide layer of the gate electrode in the etching process. Accordingly, the endpoint time for etching the bottom anti-reflection coating (BARC) is relatively stable and easily controlled.

As shown in FIG. 2, the etching process results of the wafers, which have been treated by the waferless seasoning process 108 for 250 seconds, is denoted by a curve 20. The etching process result for the wafers for which the waferless seasoning process 108 has not been previously performed is denoted by a curve 22. Comparing the curve 20 with the curve 22, after the waferless seasoning process 108 has been performed for 250 seconds, the etching process result relatively quickly reaches a stable situation. Incidentally, after the seasoning process has been performed for 250 seconds, the etching process result has a relatively small CD bias.

As shown in FIG. 3, after the etching process, the CD bias of the wafers for which the waferless seasoning process 108 has not been previously performed is denoted by a curve 30. After the etching process, the CD bias of the wafers, which have been treated by dry cleaning process 102 for 250 seconds, is denoted by a curve 32. After the etching process, the CD bias of the wafers, which have been treated by the dry cleaning process 106 and the etching-chamber recovery process for 250, 150 and 100 seconds, are respectively denoted by a curve 34, 36 and 38. The CD bias is very large between each of the first three wafers and the etching environment is very unstable at the beginning of the etching process when the waferless seasoning process 108 (as shown by the curve 30) has not been performed. The etching environment becomes stable after the etching process is performed to etch several wafers.

Comparing the curve 32 with the curve 34, the CD bias of each wafer as shown by the curve 32 is similar to the CD bias of each wafer as shown by the curve 34, and the CD biases of each wafer is relatively small. This indicates that both seasoning processes mentioned above can avoid the first wafer effect and wafer consumption.

As shown in FIG. 4, the endpoint time of etching BARC of the first three wafers, which have been treated by the waferless seasoning process 108 for 250 seconds, is denoted by a curve 40. Besides previously performing the waferless seasoning process 108, the endpoint time of etching BARC of the first three wafers is denoted by curve 42. Comparing the curve 40 with the curve 42, obviously, all endpoint times of etching BARC for the first three wafers as shown by the curve 40 is shorter than all endpoint times of etching BARC for the first three wafers as shown by the curve 4. Moreover, each endpoint time of etching BARC for the first three wafers as shown by the curve 40 is relatively stable. This indicates that the waferless seasoning process 108 according to the invention can prevent the occurrence of the first wafer effect during the etching process. Furthermore, since the plasma has HBr or hydrogen in the seasoning process 108 and the conditions of the etching chamber are similar to the conditions when the etching process is performed to etch the BARC, the plasma is good for stabilizing the endpoint time of etching BARC.

As shown in FIG. 5, the CD biases of the first wafer when the waferless seasoning process 108 is not performed is denoted by a curve 50. After the etching process, the CD biases of the first wafer, which have been treated by waferless seasoning process 108 for 100, 150 and 250 seconds, are respectively denoted by signals 52, 54 and 56. The CD bias of the signal 50 is greatly larger than that of the signals 52, 54 and 56, and the CD biases of the signals 52, 54 and 56 are similar to each other. Hence, the CD bias of the first wafer, which has been treated by waferless seasoning process 108 is relatively small. This indicates that the waferless seasoning process 108 can efficiently avoid the first wafer effect and the quality of the etching process is very stable.

After many etching processes have been performed on polysilicon or silicide, the deposit in the etching chamber is removed by the waferless seasoning process 108. The waferless seasoning process 108 comprises the dry cleaning process 102 or the dry cleaning process 106 and the etching-chamber restoration process 104. By using the invention, there is no wafer in the etching chamber during the seasoning process so that wafer consumption and the cost can be reduced. Additionally, the invention can provide a stable etching environment for the etching process and the first wafer effect can be avoided. Incidentally, the duration between two wet cleaning processes can be greatly extended and the throughput is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A waferless seasoning process used to season an etching chamber of an etching machine before an etching process is performed, the process comprising the step of:

performing a dry cleaning process in the etching chamber with a plasma formed by oxygen and hydrogen bromide to restore an etching environment in the etching chamber, wherein the etching chamber is free of wafers while performing the dry cleaning process.

2. The process of claim 1, wherein the standard-cubic centimeter per minute ratio of hydrogen bromide to oxygen is about 50/20, the pressure of the plasma is about 10 milli-torr and the power of the plasma is about 700 W.

3. The process of claim 2, wherein the dry cleaning process is performed for about of 60–300 seconds.

4. A waferless seasoning process used to season an etching chamber of an etching machine to avoid the first wafer effect, the process comprising the steps of:

performing a dry cleaning process in the etching chamber with a first plasma formed by oxygen and sulfonium hexafluoride, wherein the etching chamber is free of wafers while performing the dry cleaning process; and performing an etching-chamber recovery process with a second plasma; formed by hydrogen.

5. The process of claim 4, wherein the standard-cubic centimeter per minute ratio of oxygen to sulfonium hexafluoride is about 100/150, the pressure of the first plasma is about 15 milli-torr and the power of the first plasma is about 700 W.

6. The process of claim 5, wherein the dry cleaning process is performed for about of 60–300 seconds.

7. The process of claim 4, wherein the pressure of the second plasma is about 10–100 milli-torr and the power of the second plasma is about 500–700 W.

8. The process of claim 7, wherein the etching-chamber recovery process is performed for about of 60–300 seconds.

9. A process for cleaning an etching chamber of an etching machine before an etching process is performed, the process comprising the steps of:

performing a waferless seasoning process in the etching chamber, wherein the etching chamber is free of wafers while performing the seasoning process, and the seasoning process using a plasma of oxygen and hydrogen bromide or a plasma of oxygen and sulfonium hexafluoride; and performing at least a testing process until the etching environment in the etching chamber is restored.

10. The process of claim 9, wherein when the testing result indicates that the etching environment in the etching chamber is not restored, it is necessary to repeat the waferless seasoning process after the testing process.

11. The process of claim 10, wherein the testing result is that a particle concentration in the etching chamber is more than 30 particles/m$^3$ with a particle size of 0.02 micrometer-diameter and larger.

12. The process of claim 10, wherein when the testing result indicates that the etching environment in the etching chamber is not restored after the waferless seasoning process is repeated two times, it is necessary to perform a wet cleaning process to restore the etching environment.

13. The process of claim 9, wherein the seasoning process includes a dry cleaning process.

14. The process of claim 13, wherein the dry cleaning process is performed by a plasma for about 60–300 seconds, the plasma consists of substantially oxygen and hydrogen.

15. The process of claim 14, wherein the standard-cubic centimeter per minute ratio of hydrogen bromide to oxygen is about 50/20, the pressure of the plasma is about 10 milli-torr and the power of the plasma is about 700 W.

16. The process of claim 9, wherein the seasoning process includes a dry cleaning process and an etching-chamber recovery process.

17. The process of claim 16, wherein the dry cleaning process is performed by a plasma formed by oxygen and sulfonium hexafluoride for about of 60–300 seconds.

18. The process of claim 17, wherein the standard-cubic centimeter per minute ratio of oxygen to sulfonium hexafluoride is about 100/150, the pressure of the plasma is about 15 milli-torr and the power of the plasma is about 700 W.

19. The process of claim 16, wherein the etching-chamber recovery process is performed by a plasma formed by hydrogen for about of 60–300 seconds.

20. The process of claim 19, wherein the pressure of the plasma is about 10–100 milli-torr and the power of plasma is about 500–700 W.

* * * * *